(12) United States Patent
Rao et al.

(10) Patent No.: US 11,895,899 B2
(45) Date of Patent: Feb. 6, 2024

(54) DISPLAY PANEL AND PHOTOSENSITIVE DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Yang Rao, Shenzhen (CN); Leli Peng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 370 days.

(21) Appl. No.: 17/298,013

(22) PCT Filed: Apr. 30, 2021

(86) PCT No.: PCT/CN2021/091612
§ 371 (c)(1),
(2) Date: May 27, 2021

(87) PCT Pub. No.: WO2022/222188
PCT Pub. Date: Oct. 27, 2022

(65) Prior Publication Data
US 2023/0301156 A1    Sep. 21, 2023

(30) Foreign Application Priority Data

Apr. 19, 2021 (CN) .......................... 202110418842.9

(51) Int. Cl.
*H10K 59/60* (2023.01)
*G06F 3/0488* (2022.01)
(Continued)

(52) U.S. Cl.
CPC .......... *H10K 59/60* (2023.02); *G06F 3/0421* (2013.01); *G06F 3/0488* (2013.01); *H10K 59/40* (2023.02); *G06F 3/03542* (2013.01)

(58) Field of Classification Search
CPC .............. G06F 3/042–0421; G06F 3/041–047; G06F 2203/041–04114; G06F 3/04186;
(Continued)

(56) References Cited

U.S. PATENT DOCUMENTS

| | | | |
|---|---|---|---|
| 2004/0021643 A1 | 2/2004 | Hoshino et al. | |
| 2006/0192766 A1* | 8/2006 | Nakamura ............ | G06F 3/0412 345/173 |

(Continued)

FOREIGN PATENT DOCUMENTS

| | | |
|---|---|---|
| CN | 1797306 A | 7/2006 |
| CN | 101825462 A | 9/2010 |

(Continued)

OTHER PUBLICATIONS

International Search Report in International application No. PCT/CN2021/091612, dated Jan. 14, 2022.

(Continued)

*Primary Examiner* — Sanjiv D. Patel
(74) *Attorney, Agent, or Firm* — PV IP PC; Wei Te Chung; Zhigang Ma

(57) ABSTRACT

The present application discloses a display panel and a photosensitive display device. The display panel includes a photosensitive array, an acquisition module, and a process module. The process module acquires target frame photosensitive data according to a difference result between a current frame photosensitive data and a previous frame photosensitive data, and deducts influence of background light or ambient light to the current frame photosensitive data, and then determines a current frame display coordinate of an external light source based on the target frame pho- (Continued)

| R/C | C1 | C2 | ....... | Cn |
|---|---|---|---|---|
| R1 | D11 | D12 | ....... | D1n |
| R2 | D21 | D22 | ....... | D2n |
| ....... | ....... | ....... | ....... | ....... |
| Rm | Dm1 | Dm2 | ....... | Dmn | tosensitive data, which can improve accuracy of the current frame display coordinate.

12 Claims, 7 Drawing Sheets

(51) Int. Cl.
*H10K 59/40* (2023.01)
*G06F 3/042* (2006.01)
*G06F 3/0354* (2013.01)

(58) Field of Classification Search
CPC ......... G06F 2203/04104; G06F 3/0412; G06F 3/03547; H10K 59/40; H10K 59/60; G02F 1/13338; G02F 1/13312; G06V 20/46
See application file for complete search history.

(56) References Cited

U.S. PATENT DOCUMENTS

| | | | |
|---|---|---|---|
| 2011/0221707 A1 | 9/2011 | Oyobe et al. | |
| 2013/0265616 A1* | 10/2013 | Okada | G06F 3/04184 |
| | | | 358/406 |

FOREIGN PATENT DOCUMENTS

| | | | | |
|---|---|---|---|---|
| CN | 102298458 A | 12/2011 | | |
| CN | 104200784 A | 12/2014 | | |
| CN | 106707576 A | 5/2017 | | |
| CN | 107728976 A | 2/2018 | | |
| CN | 108196729 A | 6/2018 | | |
| CN | 108833812 A | 11/2018 | | |
| CN | 109710114 A | 5/2019 | | |
| CN | 111179865 A | 5/2020 | | |
| CN | 112289256 A | 1/2021 | | |
| KR | 20100095126 A | * | 8/2010 | ......... G06F 3/03547 |

OTHER PUBLICATIONS

Written Opinion of the International Search Authority in International application No. PCT/CN2021/091612, dated Jan. 14, 2022.
Chinese Office Action issued in corresponding Chinese Patent Application No. 202110418842.9 dated Dec. 31, 2021, pp. 1-6.
Notification to Grant Patent Right for Invention issued in corresponding Chinese Patent Application No. 202110418842.9 dated Apr. 13, 2022, pp. 1-4.

* cited by examiner

| R/C | C1 | C2 | ...... | Cn |
|---|---|---|---|---|
| R1 | D11 | D12 | ...... | D1n |
| R2 | D21 | D22 | ...... | D2n |
| ...... | ...... | ...... | ...... | ...... |
| Rm | Dm1 | Dm2 | ...... | Dmn |

FIG. 4

| R/C | C1 | C2 | ...... | Cn |
|-----|-----|-----|--------|-----|
| R1 | D11' | D12' | ...... | D1n' |
| R2 | D21' | D22' | ...... | D2n' |
| ...... | ...... | ...... | ...... | ...... |
| Rm | Dm1' | Dm2' | ...... | Dmn' |

FIG. 5

DISPLAY PANEL AND PHOTOSENSITIVE DISPLAY DEVICE

RELATED APPLICATIONS

This application is a Notional Phase of PCT Patent Application No. PCT/CN2021/091612 having international filing date of Apr. 30, 2021, which claims the benefit of priority of Chinese Patent Application No. 202110418842.9 filed on Apr. 19, 2021. The contents of the above applications are all incorporated by reference as if fully set forth herein in their entirety.

FIELD OF INVENTION

The present application relates to a field of display technologies, especially to a display panel and a photosensitive display device.

BACKGROUND OF INVENTION

With the development of information technologies, types of display technologies used for image display have increased. There are also many types of display panels such as liquid crystal display device, plasma display panel, and organic light emitting diode display device, etc. in use.

With development of a photosensitive interaction technology of display panels, the photosensitive interaction technology can be a technology integrating a photosensitive sensor into a display panel and using an external light source as a control source for achieving precise remote interaction.

However, since an environment where the display panel is located always has some ambient light or background light, the ambient light or background light may affect final photosensitive data. The display panel needs to obtain display coordinate of the external light source through a corresponding photosensitive data. Therefore, the obtained display coordinate has an issue of low accuracy.

SUMMARY OF INVENTION

Technical Issue

The present application provides a display panel and a photosensitive display device to solve the technical issue that accuracy of a display coordinate of an external light source in a remote photosensitive interaction technology of the display panel is not high.

Technical Solution

In a first aspect, the present application provides a display panel, comprising: a photosensitive array, wherein the photosensitive array comprises at least one set of photosensitive units arranged in an array; an acquisition module, electrically connected to the photosensitive units and configured to acquire photosensitive data of the photosensitive array, and wherein the photosensitive data comprises previous frame photosensitive data and current frame photosensitive data; and a process module, connected to the acquisition module, configured to acquire target frame photosensitive data according to a difference result between the current frame photosensitive data and the previous frame photosensitive data, and to determine a current frame display coordinate of an external light source based on the target frame photosensitive data, wherein the current frame display coordinate is a display coordinate corresponding to the current frame photosensitive data.

In some embodiments, the process module comprises a process unit and a storage unit; the process unit and the storage unit are connected to the acquisition module; the storage unit is configured to cache the previous frame photosensitive data; and the process unit is configured to determine the current frame display coordinate.

In some embodiments, the photosensitive data acquired by the acquisition module comprises a photosensitive coordinate of at least one of the photosensitive units and read-out data corresponding to the photosensitive coordinate; the process unit acquires target read-out data in the target frame photosensitive data according to a difference result between read-out data in the current frame photosensitive data corresponding to the same photosensitive coordinate and read-out data in the previous frame photosensitive data, and acquires a current frame average photosensitive coordinate of the external light source based on the photosensitive coordinate of each of the photosensitive units and the target read-out data corresponding to the photosensitive coordinate, and the current frame average photosensitive coordinate is an average photosensitive coordinate corresponding to the current frame photosensitive data.

In some embodiments, the photosensitive coordinate comprises a photosensitive abscissa and a photosensitive ordinate; the current frame average photosensitive coordinate comprises a current frame average photosensitive abscissa and a current frame average photosensitive ordinate; and the process unit acquires the current frame average photosensitive abscissa of the external light source based on the photosensitive ordinate and the target read-out data corresponding to each of the photosensitive units.

In some embodiments, the process unit acquires the current frame average photosensitive abscissa according to a formula as follows:

$$x_A = \frac{\sum_{i=1, j=1}^{i=n, j=m} C_i D_{ij}}{\sum_{i=1}^{n} C_i}$$

wherein $x_A$ indicates the current frame average photosensitive abscissa; $C_i$ indicates a current column number of the photosensitive units in the photosensitive array; $D_{ij}$ indicates the target read-out data of the photosensitive unit of a $j^{th}$ row and an $i^{th}$ column in the photosensitive array; m indicates a total photosensitive row number of the photosensitive units in the photosensitive array; and n indicates a total photosensitive column number of the photosensitive units in the photosensitive array.

In some embodiments, the process unit acquires the current frame average photosensitive ordinate of the external light source based on the photosensitive abscissa and the target read-out data corresponding to each of the photosensitive units.

In some embodiments, the process unit acquires the current frame average photosensitive ordinate according to a formula as follows:

$$y_A = \frac{\sum_{i=1, j=1}^{i=n, j=m} R_j D_{ij}}{\sum_{j=1}^{n} R_j}$$

wherein $y_A$ indicates the current frame average photosensitive ordinate; $R_j$ indicates a current row number of the photosensitive units in the photosensitive array; and $D_{ij}$ indicates the target read-out data of the photosensitive unit of the $j^{th}$ row and the $i^{th}$ column in the photosensitive array.

In some embodiments, a total display row number of sub-pixels in the display panel is M; a total display column number of the sub-pixels in the display panel is N; the current frame display coordinate comprises a current frame display abscissa and a current frame display ordinate; the process unit determines the current frame display abscissa of the external light source based on the total photosensitive row number, the total display row number, and the current frame average photosensitive abscissa; and the process unit determines the current frame display ordinate of the external light source based on the total photosensitive column number, the total display column number, and the current frame average photosensitive ordinate.

In some embodiments, the current frame display abscissa is acquired according to a formula as follows:

$$X_A = M \times x_A \div m$$

wherein $X_A$ indicates the current frame display abscissa; and/or the current frame display ordinate is acquired according to a formula as follows:

$$Y_A = N \times x_A \div n$$

wherein $Y_A$ indicates the current frame display ordinate.

In a second aspect, the present application provides a photosensitive display device, comprising the display panel of any one of the above embodiments.

Advantages

The display panel and the photosensitive display device of the present application, through the acquisition module, can acquire previous frame photosensitive data and current frame photosensitive data of the photosensitive array. The process module acquires target frame photosensitive data according to a difference result according to the current frame photosensitive data and the previous frame photosensitive data, and can deduct influence of background light or ambient light to the current frame photosensitive data, and then determine a current frame display coordinate of the external light source based on the target frame photosensitive data, which can improve accuracy of the current frame display coordinate to further achieve precise remote photosensitive interaction of the display panel.

DESCRIPTION OF DRAWINGS

FIG. 4 is a schematic structural view of previous frame photosensitive data provided by the present application embodiment.

FIG. 5 is a schematic structural view of current frame photosensitive data provided by the present application embodiment.

DETAILED DESCRIPTION OF PREFERRED EMBODIMENTS

To make the objective, the technical solution, and the effect of the present application clearer and more explicit, the present application will be further described in detail below with reference to the accompanying drawings. It should be understood that the specific embodiments described here are only used to explain the present application instead of being used to limit the present application.

Figure 1:
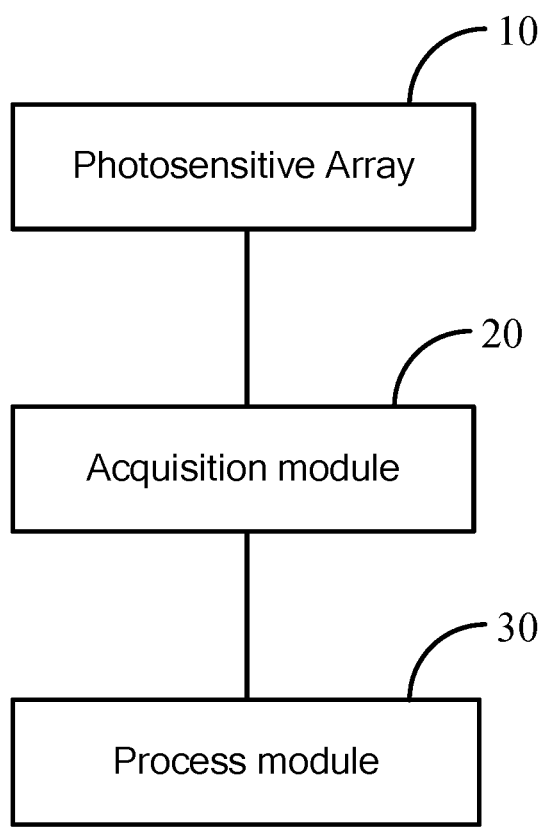
FIG. 1 is a first schematic structural view of a display panel provided by the present application embodiment.
Figure 2:
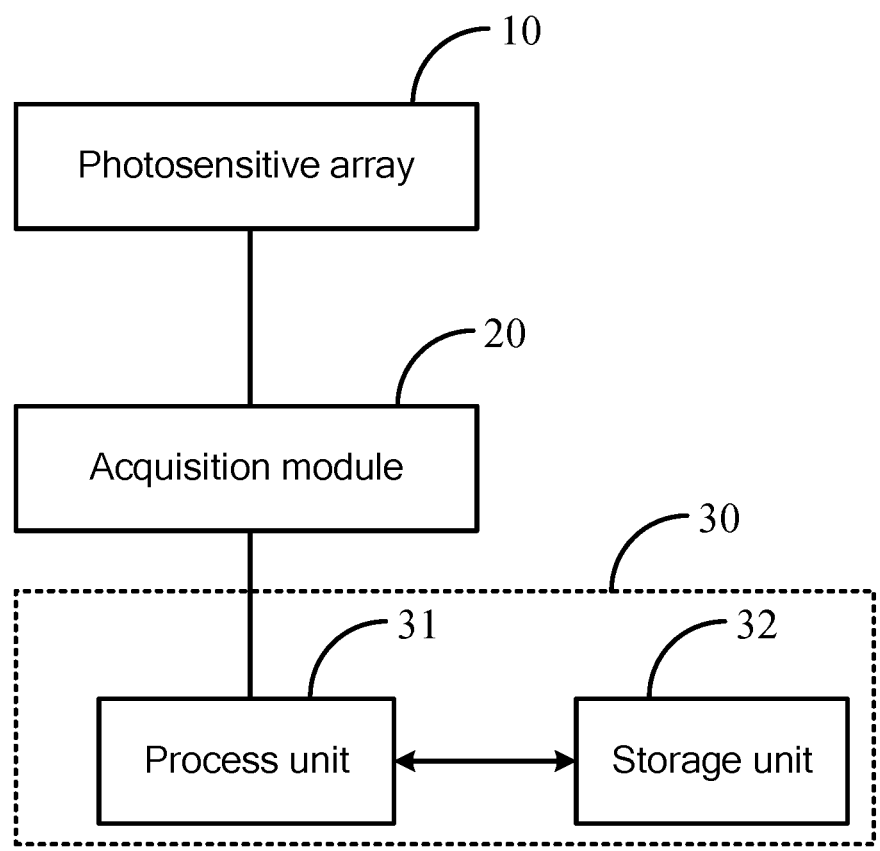
FIG. 2 is a second schematic structural view of the display panel provided by the present application embodiment.
Figure 3:
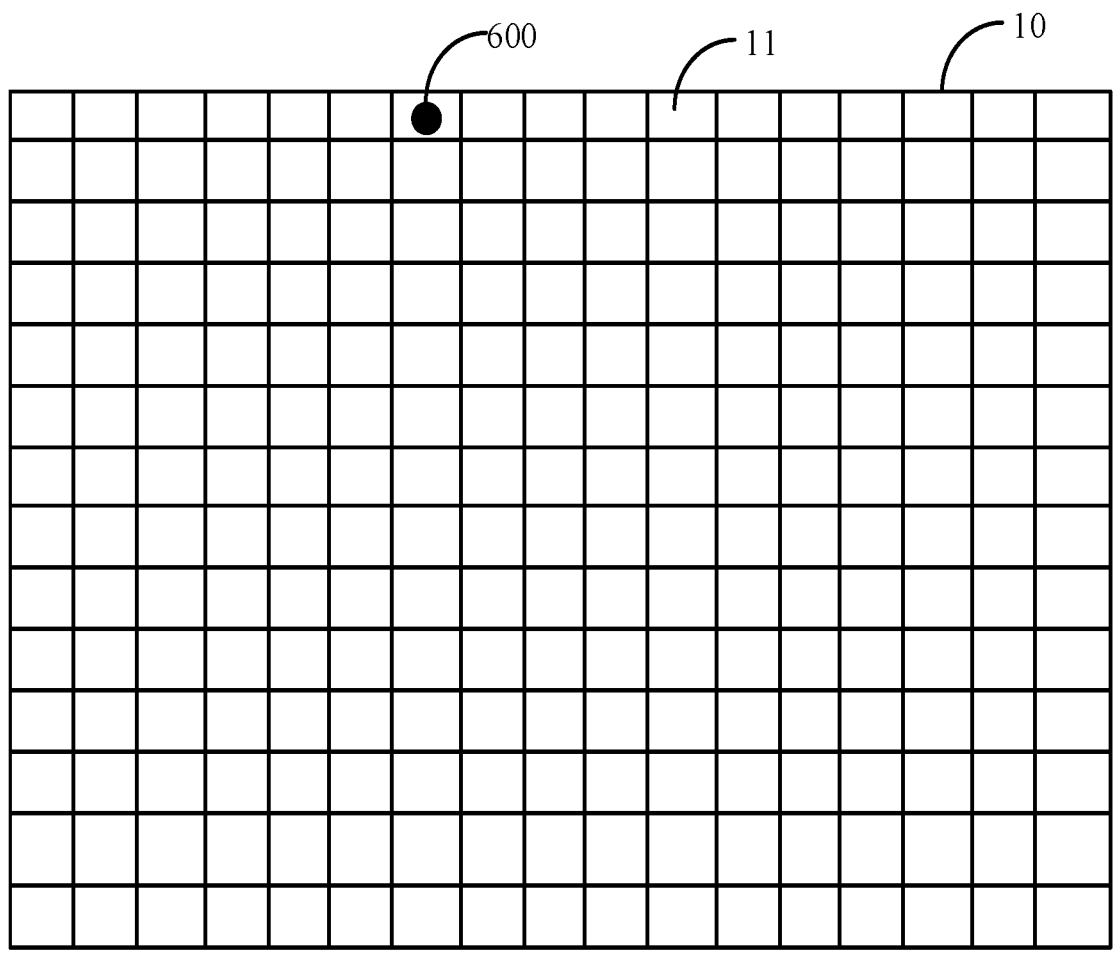
FIG. 3 is a third schematic structural view of the display panel provided by the present application embodiment.

With reference to FIGS. 1 to 7, as shown in FIGS. 1, 2, and 3, the present embodiment provides a display panel, comprising a photosensitive array 10, an acquisition module 20, and a process module 30. The photosensitive array 10 comprises at least one set of photosensitive units 11 arranged in an array. The acquisition module 20 is electrically connected to the photosensitive units 11, and is configured to acquire photosensitive data of the photosensitive array 10. The photosensitive data comprises previous frame photosensitive data and current frame photosensitive data. The process module 30 is connected to the acquisition module 20, is configured to acquire target frame photosensitive data according to a difference result between the current frame photosensitive data and the previous frame photosensitive data, and to determine a current frame display coordinate of an external light source 600 based on the target frame photosensitive data. The current frame display coordinate is a display coordinate corresponding to the current frame photosensitive data.

It can be understood that the display panel provided by the present embodiment can acquire the previous frame photosensitive data and the current frame photosensitive data of the photosensitive array 10 by the acquisition module 20. The process module 30 acquires the target frame photosensitive data according to the difference result between the current frame photosensitive data and the previous frame photosensitive data such that influence of the background light or ambient light to the current frame photosensitive data can be deducted, and then determines the current frame display coordinate of the external light source 600 based on the target frame photosensitive data such that accuracy of the current frame display coordinate can be increased to further achieve precise remote photosensitive interaction of the display panel.

It can be understood that during determining the current frame display coordinate of the external light source 600, the previous frame photosensitive data can be stored in the process module 30 as a background value. When the external light source 600, for example a laser pen, irradiates, the background value is deducted on the basis of the current frame photosensitive data to acquire the target frame photosensitive data, and to determine the current frame display coordinate of the current frame photosensitive data based on the target frame photosensitive data, which can enhance real-time characteristic and accuracy of the current frame display coordinate.

It should be explained that the acquisition module 20 can be but is not limited to a photosensitive data read chip, and also can be a photosensitive data read integrated circuit. It can acquire photosensitive data of an entire frame, for example, previous frame photosensitive data and/or current frame photosensitive data.

The display panel can further comprise sub-pixels of rows of a number M and columns of a number N, the display coordinate can be a number of rows and a number of columns corresponding to a sub-pixel, for example, the display coordinate can be indicated as (M, N).

It can be understood that external light source 600 can be but is not limited to a laser light source emitted by a laser pen, and can also be an infrared light source. When the external light source 600 irradiates a corresponding photosensitive unit 11, the photosensitive unit 11 converts the light signal into a corresponding electrical signal. The acquisition module 20 can acquire electrical signals in different photosensitive units 11 and photosensitive coordinates of corresponding photosensitive units 11 in the photosensitive array 10. Then, the process module 30 can acquire a display coordinate corresponding to the external light source 600 according to photosensitive data in a display frame, which can provide implementation foundation for the display panel proceeding with remote photosensitive interaction.

With reference to FIG. 2, in an embodiment, process module 30 comprises a process unit 31 and a storage unit 32. The process unit 31 and the storage unit 32 are connected to the acquisition module 20. The storage unit 32 is configured to cache previous frame photosensitive data. The process unit 31 is configured to determine current frame display coordinate.

In an embodiment, the photosensitive data acquired by the acquisition module 20 comprises a photosensitive coordinate of at least one of the photosensitive units 11 and read-out data corresponding to the photosensitive coordinate. The process unit 31 acquires target read-out data in the target frame photosensitive data according to a difference result between read-out data in the current frame photosensitive data corresponding to the same photosensitive coordinate and read-out data in the previous frame photosensitive data, and acquires a current frame average photosensitive coordinate of the external light source 600 based on the photosensitive coordinate of each of the photosensitive units and the target read-out data corresponding to the photosensitive coordinate. The current frame average photosensitive coordinate is an average photosensitive coordinate corresponding to the current frame photosensitive data.

With reference to FIG. 3, it should be explained that the photosensitive array 10 can comprise photosensitive units 11 of rows of a number m and columns of a number n. The row and the column where the photosensitive unit 11 is located in the photosensitive array 10 is a photosensitive coordinate of a corresponding photosensitive unit 11. The photosensitive coordinate can be (m, n). The read-out data can be an electrical signal stored in the corresponding photosensitive unit 11, for example, in a display frame, when the photosensitive unit 11 is not irradiated by the external light source 600, the electrical signal stored in the photosensitive unit 11 will be infinitely close to 0. In a display frame, when the photosensitive units 11 are irradiated by the external light source 600, the electrical signal stored in the photosensitive units 11 will be greater than 0, and the electrical signal stored by the photosensitive units 11 would increase with increase of irradiation intensity and/or irradiation time of the external light source 600. Accordingly, the read-out data would become larger. The acquisition module 20 can correspondingly acquire the photosensitive coordinate of each of the photosensitive units 11 and the read-out data of the corresponding photosensitive unit 11. The process module 30 can acquire an average photosensitive coordinate corresponding to the external light source 600 in the current frame according to the photosensitive coordinates and the read-out data of these photosensitive units 11.

With reference to FIG. 4, it can be previous frame photosensitive data of the photosensitive array 10 acquired by the acquisition module 20 in a display frame. R can be used to indicate a row of the photosensitive array 10, and Rm can be used to indicate a number of the row of the photosensitive array 10; C is used to indicate a column of the photosensitive array 10, and Cn is used to indicate a number of the column of the photosensitive array 10; Dmn indicates read-out data of the photosensitive unit 11 of an $m^{th}$ row and an $n^{th}$ column in the photosensitive array 10. For example, read-out data of the photosensitive unit 11 of a first row R1 and a first column C1 can be D11, read-out data of the photosensitive unit 11 of the first row R1 and a second column C2 can be D12; read-out data of the photosensitive unit 11 of the first row R1 and the nth column Cn can be D1n. Read-out data of the photosensitive unit 11 of a second row R2 and the first column C1 can be D21; read-out data of the photosensitive unit 11 of the second row R2 and the second column C2 can be D22; read-out data of the photosensitive unit 11 of the second row R2 and the nth column Cn can be D2n. Read-out data of the photosensitive unit 11 of the $m^{th}$ row Rm and the first column C1 can be Dm1; read-out data of the photosensitive unit 11 of the $m^{th}$ row Rm and the second column C2 can be Dm2; and read-out data of the photosensitive unit 11 of the $m^{th}$ row Rm and the nth column Cn can be Dmn.

With reference to FIG. 5, it can be current frame photosensitive data of the photosensitive array 10 acquired by the acquisition module 20 in a display frame. R can be used to indicate the row of the photosensitive array 10, and Rm can be used to indicate the number of the row of the photosensitive array 10; C is used to indicate the column of the photosensitive array 10, Cn is used to indicate the number of the column of the photosensitive array 10; Dmn' indicates read-out data of the photosensitive unit 11 of the $m^{th}$ row and the nth column in the photosensitive array 10. For example, read-out data of the photosensitive unit 11 of the first row R1 and the first column C1 can be D11'; read-out data of the photosensitive unit 11 of the first row R1 and the second column C2 can be D12'; read-out data of the photosensitive unit 11 of the first row R1 and the nth column Cn can be D1n'. Read-out data of the photosensitive unit 11 of the second row R2 and the first column C1 can be D21', read-out data of the photosensitive unit 11 of the second row R2 and the second column C2 can be D22'; read-out data of the photosensitive unit 11 of the second row R2 and the nth column Cn can be D2n'. Read-out data of the photosensitive unit 11 of the $m^{th}$ row Rm and the first column C1 can be Dm1'; read-out data of the photosensitive unit 11 of the $m^{th}$ row Rm and the second column C2 can be Dm2'; read-out data of the photosensitive unit 11 of the $m^{th}$ row Rm and the nth column Cn can be Dmn'.

Accordingly, in the target frame photosensitive data corresponding to the current frame photosensitive data, target read-out data of the photosensitive unit 11 of the first row R1 and the first column C1 can be D11 target read-out data of the photosensitive unit 11 of the first row R1 and the second column C2 can be D12'-D12; target read-out data of the photosensitive unit 11 of the first row R1 and the nth column Cn can be D1n'-D1n. Target read-out data of the photosensitive unit 11 of the second row R2 and the first column C1 can be D21'-D21 target read-out data of the photosensitive unit 11 of the second row R2 and the second column C2 can be D22'-D22; target read-out data of the photosensitive unit 11 of the second row R2 and the nth column Cn can be D2n'-D2n. Target read-out data of the photosensitive unit 11 of the $m^{th}$ row Rm and the first column C1 can be Dm1'-Dm1; Target read-out data of the photosensitive unit 11 of the $m^{th}$ row Rm and the second column C2 can be Dm2'-Dm2; target read-out data of the photosensitive unit 11 of the $m^{th}$ row Rm and the nth column Cn can be Dmn'-Dmn.

In an embodiment, the photosensitive coordinate comprises a photosensitive abscissa and a photosensitive ordinate. The current frame average photosensitive coordinate comprises a current frame average photosensitive abscissa and a current frame average photosensitive ordinate. The process unit 31 acquires a current frame average photosensitive abscissa of the external light source 600s based on the photosensitive ordinate and the target read-out data corresponding to each of the photosensitive units 11.

Specifically, the process unit 31 acquires the current frame average photosensitive abscissa according to a formula as follows:

$$x_A = \frac{\sum_{i=1,j=1}^{i=n,j=m} C_i D_{ij}}{\sum_{i=1}^{n} C_i}$$

wherein $x_A$ indicates the current frame average photosensitive abscissa; $C_i$ indicates a current column number of the photosensitive units 11 in the photosensitive array 10; $D_{ij}$ indicates the target read-out data of the photosensitive unit 11 of a $j^{th}$ row and an $i^{th}$ column in the photosensitive array 10; m indicates a total photosensitive row number of the photosensitive units 11 in the photosensitive array 10; and n indicates a total photosensitive column number of the photosensitive units 11 in the photosensitive array 10.

In an embodiment, the process unit 31 acquires the current frame average photosensitive ordinate of the external light source 600 based on the photosensitive abscissa and the target read-out data corresponding to each of the photosensitive units 11.

Specifically, the process unit 31 acquires the current frame average photosensitive ordinate according to a formula as follows:

$$y_A = \frac{\sum_{i=1,j=1}^{i=n,j=m} R_j D_{ij}}{\sum_{j=1}^{n} R_j}$$

wherein $y_A$ indicates the current frame average photosensitive ordinate; $R_j$ indicates a current row number of the photosensitive units 11 in the photosensitive array 10; and $D_{ij}$ indicates target read-out data of the photosensitive unit 11 of the $j^{th}$ row and the $i^{th}$ column in the photosensitive array 10.

In an embodiment, a total display row number of sub-pixels in the display panel is M; a total display column number of the sub-pixels in the display panel is N; the current frame display coordinate comprises a current frame display abscissa and a current frame display ordinate; the process unit 31 determines the current frame display abscissa of the external light source 600 based on the total photosensitive row number, the total display row number, and the current frame average photosensitive abscissa; and the process unit 31 determines the current frame display ordinate of the external light source 600 based on the total photosensitive column number, the total display column number, and the current frame average photosensitive ordinate.

In an embodiment, current frame display abscissa is acquired according to a formula as follows:

$$X_A = M \times x_A \div m$$

wherein $X_A$ indicates the current frame display abscissa; and/or
current frame display ordinate is acquired according to a formula as follows:

$$Y_A = N \times x_A \div n$$

wherein $Y_A$ indicates the current frame display ordinate.
wherein $Y_A$ indicates the current frame display ordinate, and the current frame display ordinate can be a corresponding display column number. It should be explained that when the acquired current frame display ordinate is a non-integer, the process module 30 can further perform integerization calculation to the current frame display ordinate. For example, integerization calculation is performed to the current frame display ordinate by rounding, or integerization calculation is performed to the current frame display ordinate by taking ceiling.

As such, the current frame display abscissa and the current frame display ordinate indicated in form of integer can be acquired to correspond to the display row number and the display column number also in form of integer.

Therefore, the process module 30 can determine a current frame display coordinate corresponding to a specific illumination location of the external light source 600 according to the current frame display abscissa and the current frame display ordinate. It can be understood that the current frame display coordinate is a key step for achieving remote photosensitive interaction of the display panel. As such, remote light control of the display screen can be achieved by the external light source 600, for example to control functional buttons on the display screen, or to implement operation such as illustrating on the display white board.

Figure 6:
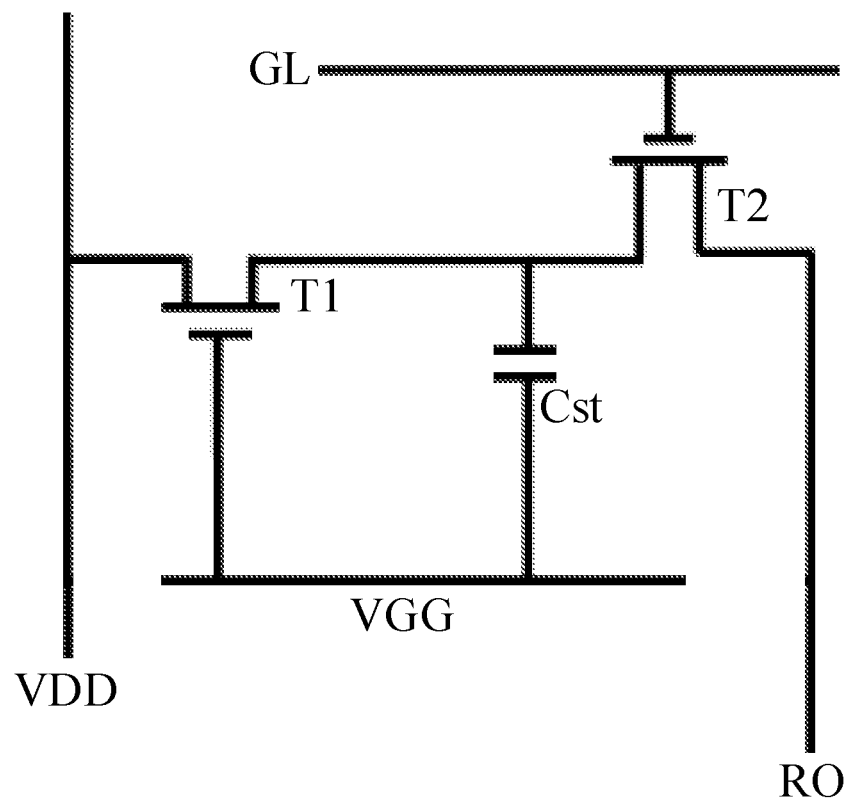
FIG. 6 is a schematic structural view of photosensitive units provided by the present application embodiment.

With reference to FIG. 6, in an embodiment, the photosensitive units can comprise a photosensitive thin film transistor T1, a read-out thin film transistor T2, and a storage capacitor Cst. One of a source electrode or a drain electrode in the photosensitive thin film transistor T1 is connected to a first power line VDD; the other of the source electrode or the drain electrode of the photosensitive thin film transistor T1 is connected an end of the storage capacitor Cst and of the read-out thin film transistor T2 is connected to one of a source electrode or a drain electrode. The other of the source electrode or the drain electrode of the read-out thin film transistor T2 is connected to the read-out signal line RO. A second power line VGG is connected to a gate electrode of the photosensitive thin film transistor T1 and another end of the storage capacitor Cst. A scan signal line GL is connected to a gate electrode of the read-out thin film transistor T2.

A signal voltage transmitted by the first power line VDD is greater than signal voltage transmitted by the second power line VGG. Scan signal line GL can also be electrically connected to at least one sub-pixel and be configured to control and read a data signal into the sub-pixels of a corresponding sub-pixel row. The read-out signal line RO can be electrically connected to a read-out chip.

The first power line VDD is parallel to the read-out signal line RO. The second power line VGG is parallel to the scan signal line GL. The first power line VDD is perpendicular to and not connected to the second power line VGG. The read-out signal line RO is perpendicular to and not connected to the scan signal line GL. It can be understood that disconnection of the place can be no electrical connection therebetween.

In an embodiment, display panel of the above embodiment can be but is not limited to organic light emitting diode (OLED) display, and is a display using organic self-light emitting diodes. Because of characteristics of self-luminous organic light emitting diodes, backlight source-free, high contrast, thin thickness, wide viewing angle, fast response, applicability for flexible display panel, wide temperature range, simple structure and manufacturing process, etc., it is considered as emerging application technology of a next-generation flat display device.

Organic light emitting diode (OLED) display devices are becoming more and more common, and are most prominent in products such as cell phone, media player, and small entry level television. Unlike standard liquid crystal display devices, OLED pixels are driven by current sources.

The OLED display device is a self-luminous display device technology and does not require any backlight at all. The material used in the OLED is an organic material with a chemical structure. The OLED technology requires a current control and drive method. The OLED is quite similar to a standard light emitting diode (LED) in electrical characteristics. Brightness depends on the LED current. To turn on and off the OLED and control the OLED current, a control circuit with thin film transistors (TFTs) is required.

An advanced energy saving mode can achieve the highest efficiency same as that of any battery-powered device. Only when the converter operates at the highest efficiency of the overall load current range can a longer battery standby time be achieved. This is especially important for the OLED display device. The OLED display device consumes the most power when it is fully white. For any other display colors, the current is relatively small. This is because only the white color requires all red, green, and blue sub-pixels on. For example, a 2.7-inch display device needs 80 mA current to render a completely white image, but only 5 mA current is needed to display other icons or graphics. Therefore, the OLED power supply needs to achieve high converter efficiency for all load currents. To achieve such efficiency, an advanced energy saving mode technology needs to be used to reduce the load current to reduce the converter switching frequency. Because it is completed through the voltage control oscillator (VCO), possible EMI issue can be minimized, and the lowest switching frequency can be controlled outside the general 40 kHz audio range, which can prevent the ceramic input or output capacitor from generating noise. When using such type of device in cell phone applications, it is particularly important, and can simplify the design process.

According to the luminous characteristics, white light does not consume the most power, but the brightness value determines the power consumption. For example, when red, blue, and green light each have a brightness value of 10, white light with a brightness value of 30 will be produced. Therefore, red, blue, and green light adjusted to make each have a brightness value of 3.3 synthesize a white light value of 10 (theoretical value). From the perspective of the LED or OLED, the human eye sees the same brightness, and blue light consumes the most power.

Organic light emitting display technology is composed of a very thin organic material coating layer and a glass substrate. These organic materials emit light when an electric charge passes through. The color of OLED light depends on the material of the organic light emitting layer, so manufacturers can change the light emitting layer. An active matrix organic light-emitting display screen has a built-in electronic circuit system, so each pixel is independently driven by a corresponding circuit. An OLED has advantages of a simple structure, self-luminous without a backlight source, high contrast, thin thickness, wide viewing angle, fast response speed, applicability for flexible display panel, wide temperature range, and other advantages.

The complexity and information density of the car information system is increasing, which makes an internal display device of a car no longer just a basic centralized instrument display, but is required to meet needs of increasingly detailed and diversified in-car information display. The car display device market is divided into car navigation devices, car TVs, and car information systems by application.

The display products required by automotive electronics have high requirements for environmental adaptability. The performance indicators of the generally required automotive display screen are: brightness of 20 to 60 nits, room temperature working life of 50,000 hours, and temperature tolerance range of −40 to 85° C. Displayed in North American cars in the market, a vacuum fluorescent display device (VFD) has been very popular for a long time because of its excellent brightness and good visibility. However, with the rise of the OLED and LCD liquid crystal display technologies, VFDs are gradually losing their advantages. Because the power consumption of VFDs is large, full color and resolution are greatly restricted.

Compared to the sophisticated TFT-LCD, organic electroluminescence display (OLED) technology is an active-light emission display device having advantages of high contrast, wide viewing angle (up to 170°), fast response (~1 μs), high luminous efficiency, low operating voltage (3 to 10V), ultra-light and thin (thickness less than 2 mm), etc. The vehicle-mounted display device made with the OLED technology can have a thinner and more attractive appearance, better color display quality, wider viewing range and greater design flexibility, and more importantly, environmental adaptability of the OLED is far superior to the liquid crystal display, and the tolerable temperature range reaches −40 to 85° C. Furthermore, the OLED is lead-free and does not cause pollution to the environment. Therefore, OLED display applications have great advantages in the vehicle-mounted field.

A flexible screen refers to a flexible OLED. The successful mass production of flexible screens is not only a major benefit to the manufacturing of a new generation of high-end smart cell phones, but also brings far-reaching effects to the application of wearable devices because of their low power consumption and flexibility. In the future, the flexible screens will be widely used with the continuous popularity of personal smart terminals.

A flexible screen cell phone refers to a cell phone with a bendable and flexible screen.

The OLED is very thin and can be mounted on flexible material such as plastic or metal foil. Using plastic instead of glass makes the display screen more durable and lighter. The flexible OLED display panel is concave from the top to the bottom, and a bending radius thereof can be up to 700 mm.

The OLED uses a plastic substrate instead of a common glass substrate. With the help of film encapsulation technology, a protection film is adhered on the back of the display panel to make the display panel bendable and not easy to break. The flexible screen can be curved, but cannot be folded. A future product should be foldable, and a shape thereof will change more.

The display screen is cut from the display panel. The bendable display screen, also known as the flexible screen, is regarded as the initial product of the display screen revolution. The ultimate goal is to transform mobile and wearable electronic devices.

An OLED manufacturing solution uses a vacuum evaporation technology to manufacture organic functional layer and cathode layer, which requires expensive evaporation equipment and high production cost, and has low production efficiency. At the same time, limited by the size of the vacuum evaporation equipment, it is difficult to achieve the manufacture of large-area display screens. Compared with vacuum thermal evaporation, solution manufacture has the advantages of simple operation and low cost, and it is suitable for low temperature or room temperature conditions, and especially for the manufacture of large-size OLED screens. With the rapid iteration of organic electronic technology, the liquid-phase processing technology of soluble organic materials has become increasingly mature. The liquid-phase method, especially the printing process for manufacturing OLEDs, is considered to be one of key methods to solve the development bottleneck of existing OLEDs.

The display panel in the above embodiment can also be a liquid crystal display panel. The liquid crystal display panel comprises a polarizer, a glass substrate, a black matrix, a color filter, a protection film, a general electrode, a calibration layer, a liquid crystal layer (liquid crystals, spacers, sealant), capacitors, display electrodes, a prism layer, and a diffusion layer.

A polarizing film is also called "polarizer", and the polarizer is divided into an upper polarizer and a lower polarizer. The upper and lower polarizers have their polarization functions perpendicular to each other, acting like a grid blocking light wave components as required. For example, the light wave component perpendicular to the polarizer grid is blocked, and only the light wave component parallel to the grid is allowed to pass.

The glass substrate in the liquid crystal display device can be divided into an upper substrate and a lower substrate, and functions to clamp the liquid crystal material in the interval space between the two substrates. The material of the glass substrate generally adopts alkali-free borosilicate glass with excellent mechanical properties, heat resistance, and chemical resistance. For TFT-LCD, one layer of the glass substrate is distributed with TFTs, and the other layer of the glass substrate is deposited with color filters.

The black matrix is used to separate the three primary colors of red, green, and blue in the color filters (to prevent color confusion) with the help of a material with high lighting shielding performance to prevent light leakage, thereby facilitating improvement of the contrast of each color block. In addition, in the TFT-LCD, the black matrix can also cover the internal electrode traces or thin film transistors.

The color filter is also called "color filtering film", and functions to produce red, green, blue primary colors, and realize the full color display of the liquid crystal display device.

The alignment layer is also called alignment film or orientation layer, whose function is to allow liquid crystal molecules to achieve uniform alignment and orientation on the microscopic layer surface.

The transparent electrode is divided into a common electrode and a pixel electrode, and an input signal voltage is loaded between the pixel electrode and the common electrode. The transparent electrode is usually deposited with indium tin oxide (ITO) material on the glass substrate to form the transparent conductive layer.

The liquid crystal material has a function similar to a light valve in the LCD, which can control the brightness of the transmitted light, so as to achieve the effect of information display.

A driver IC is actually a set of an integrated circuit chip device, which is used to adjust and control the phase, peak value, frequency, etc. of the potential signal on the transparent electrode, and to establish a driving electrical field, and finally to realize the information display of the liquid crystal.

In the liquid crystal display panel, an active matrix liquid crystal display screen is formed by sealing a twisted nematic (TN) liquid crystal material between two glass substrates. The upper glass substrate close to the display screen is deposited with red, green, and blue (RGB) color filters of three colors (or called color filtering films), a black matrix, and common transparent electrodes. A lower glass substrate (the substrate further away from the display screen) is installed with thin film transistor (TFT) devices, transparent pixel electrodes, storage capacitors, gate lines, signal lines, etc. Alignment films (or alignment films) are manufactured between insides of the two glass substrates so that the liquid crystal molecules are aligned. The liquid crystal material is poured between the two glass substrates, and the spacers are spread to ensure the uniformity of the gap. The surroundings are bonded with a frame sealant to seal. A silver glue process is used to connect common electrodes of the upper and lower glass substrates.

When voltage is added between the pixel transparent electrode and the common transparent electrode, the arrangement state of the liquid crystal molecules will change. At this time, the intensity of the incident light through the liquid crystal also changes. The liquid crystal display device cooperates with control of the electrical field according to the optical activity of the liquid crystal material to realize the information display.

The LCD product is a non-active light emission electrical device, has no luminous characteristics itself, and must rely on the emission of the light source in the backlight module to obtain display performance. Therefore, the brightness of the LCD is determined by its backlight module. It can be seen that the performance of the backlight module directly affects the display quality of the liquid crystal display panel.

The backlight module comprises an illumination light source, a reflector plate, a light guide plate, a diffuser, a brightness enhancement film (prism film), and a frame, etc. The backlight modules used by LCDs can be divided into two categories: side-lit backlight modules and direct-lit backlight modules. Cell phones, notebooks, and monitors (15 inches) mainly use side-lit backlight modules, while liquid crystal TVs mostly use direct-lit backlight modules. The backlight module light source mainly uses cold cathode fluorescent lamps (CCFLs) and light emitting diode (LED) light sources as the backlight source of the LCD.

The reflector plate (reflector sheet) is also called reflector cup, the main function is to completely send the light emitted by the light source into the light guide plate, and reduce unnecessary loss as much as possible.

The main function of the light guide plate is to guide the light emitted by the side light source to the front of the display panel.

A prism film is also called brightness enhancement film, the main function is to concentrate the scattered light through the refraction and total reflection of the film layer, focus light on a certain angle, and then emit the light from the backlight source, and perform the display effect of screen brightness enhancement.

The main function of the diffuser is to correct the side light of the backlight module to a uniform surface light source to achieve the effect of optical diffusion. The diffuser is divided into an upper diffuser and a lower diffuser. The upper diffuser is located between the prism film and the liquid crystal components, and is closer to the display panel. The lower diffuser is located between the light guide plate and the prism film, and is closer to the backlight source.

The LCD is a display device using liquid crystal as the material. Liquid crystal is an organic compound between solid and liquid. Under room temperature conditions, it exhibits both liquid fluidity and optical anisotropy of crystals, which becomes a transparent liquid when heated, and becomes a crystalline turbid solid when cooled.

Under the action of the electrical field, the arrangement of liquid crystal molecules will change, which further affects the intensity of the incident light beam passing through the liquid crystal. This change in light intensity is further manifested as a change in brightness through the action of the polarizer. According to this, through the control of the liquid crystal electrical field, the brightness of the light can be changed to achieve the purpose of information display. Therefore, the role of the liquid crystal material is similar to a small "light valve".

Because a control circuit and a driver circuit exist around the liquid crystal material, liquid crystal molecules are twisted when electrodes generate an electrical field in the LCD such that light extending therethrough is refracted regularly (optical activity of the liquid crystal material), and then is displayed on the screen through filtering of the second layer polarizer.

It is worth pointing out that liquid crystal material itself does not emit light such that LCDs usually need to set an additional light source for the display panel. A main light source system is called "backlight module", wherein a backlight plate can be composed of fluorescent substance, can emit light, and mainly functions to provide an even backlight source.

In an embodiment, the present embodiment provides a photosensitive display device, comprising the display panel 400 of any one of the above embodiments.

It can be understood that the photosensitive display device provided by the present embodiment can acquire the previous frame photosensitive data and the current frame photosensitive data of the photosensitive array through the acquisition module. The process module acquires target frame photosensitive data according to the difference result between the current frame photosensitive data and the previous frame photosensitive data, can deduce influence of the background light or the ambient light to the current frame photosensitive data, and then determine the current frame display coordinate of the external light source based on the target frame photosensitive data, which can increase accuracy of the current frame display coordinate, and can further achieve precise remote photosensitive interaction of the display panel 400.

Figure 7:
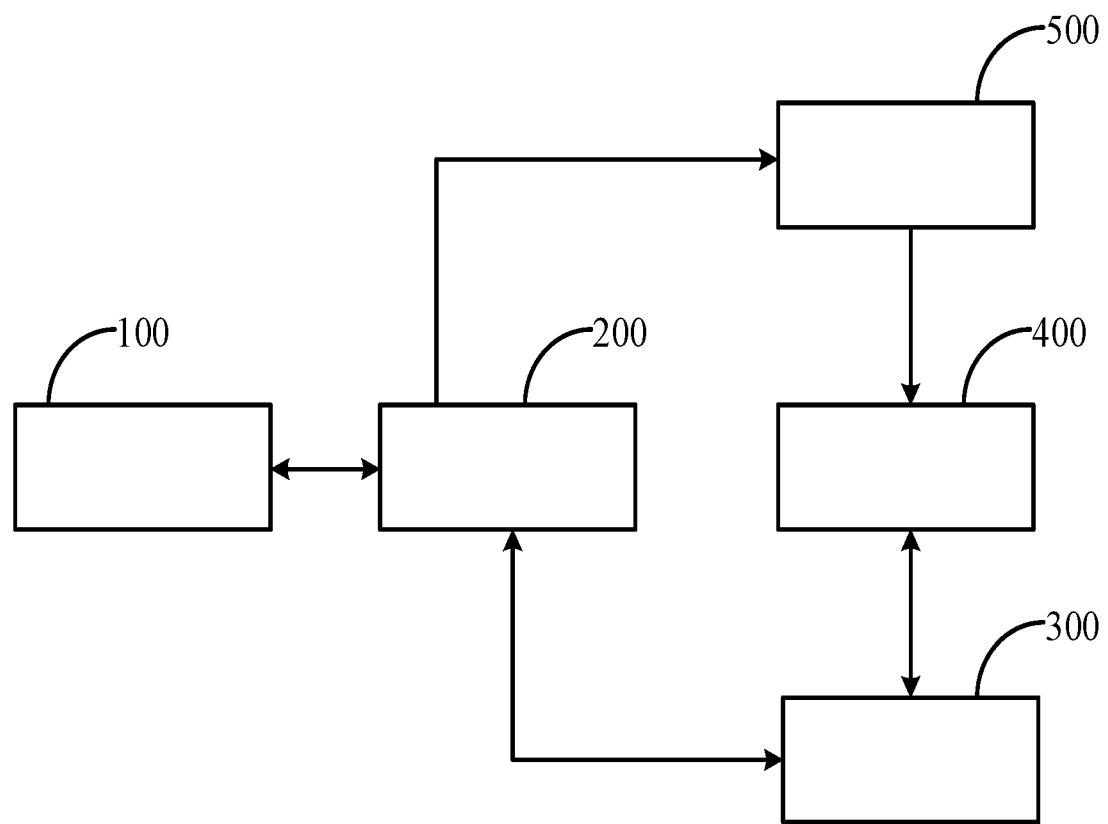
FIG. 7 is a schematic structural view of photosensitive display device provided by the present application embodiment.

With reference to FIG. 7, the photosensitive display device can further comprise a system on chip (SOC) 100, a field programmable gate array (FPGA) 200, a printed circuit board for display 500, and a photosensitive printed circuit board 300. The system on chip 100 is electrically connected to the field programmable gate array 200. The field programmable gate array 200 is electrically connected to the printed circuit board for display 500 and the photosensitive printed circuit board 300.

The system on chip 100 is also called system level chip, which means that it is a product, is an integrated circuit including a dedicated target, and comprises a complete system embedded with all contents of software. In the present embodiment, the system on chip 100 can be configured to receive and process image data inputted by an external video source and then output a corresponding video signal. In the meantime, it can also participate in the calculation process of the display coordinate of the external light source.

The field programmable gate array 200 can serve as a semi-custom circuit exclusive for the field of specific integrated circuits, which can not only solve the deficiencies of custom circuits, but also overcome the shortcomings of the limited number of gate circuits of the original programmable device. The FPGA is a semi-custom circuit exclusive for a specific integrated circuit, is a programmable logic array, and can effectively solve the issue of the original device with fewer gate circuits. A basic structure of the FPGA comprises a programmable input and output unit, a configurable logic block, digital clock management module, an embedded block, a random access memory (RAM), a wiring resource, an embedded dedicated hardcore, and a bottom layer built-in function unit. Because the FPGA has the characteristics of rich wiring resources, repeatable programming, high integration, and low investment, it has been widely used in the field of digital circuit design. A design process of the FPGA comprises algorithm design, code simulation and design, board debugging. Designer and actual needs establish algorithm architecture, use electronic design automation (EDA) to establish design solution, and ensure that the design solution meets actual requirements through code simulation, and finally perform board-level debugging and use the configuration of circuit to download the relevant files to the FPGA to verify the actual operation effect.

With the advancement of technology, video segmentation technology has gradually matured, meeting people's basic needs for clear video images. An FPGA chip has a special hardware structure, can use the pre-edited logic structure file to adjust the internal structure, use the constrained file to adjust the connection and position of different logic units, and properly handle the data line path. Its own flexibility and adaptability are convenient for users' development and application. When processing video signals, the FPGA chip can make full use of its own speed and structural advantages to implement table tennis technology and pipeline technology. In the process of external connection, the chip adopts the method of data parallel connection to make the bit widening of the image information and use the internal logic function to improve the speed of the image process. Control of the image process and other devices is achieved through the cache structure and clock management. In the overall design structure, the FPGA chip is in the core position, and the interpolation processing, extraction, and storage of complex data also provide an overall control function to ensure the stable operation of the system. Furthermore, video information processing is different from other data processing, which requires a chip with a special logic unit and RAM or FIFO unit to ensure sufficient data transmission speed.

As such, in the present embodiment, the field programmable gate array 200 can pre-process the video signal as well as pre-process the photosensitive data. It can be understood that in display technology, whether it is processing video data or photosensitive data, it can be processed in accordance with the embodiment that has been recorded in the present application. If there is no record, it can be processed using well-known techniques, which is not described repeatedly here.

It should be explained that, the printed circuit board for display 500 can comprise a timing controller, and the timing controller can control corresponding gate electrode drivers and data drivers to achieve normal display of the display panel 400.

The photosensitive printed circuit board 300 can comprise an acquisition module, for example, a read-out chip, configured to read and correspondingly process photosensitive data of the photosensitive array, or implement necessary process in the above embodiments.

It can be understood that for a person of ordinary skill in the art, equivalent replacements or changes can be made according to the technical solution of the present application and its inventive concept, and all these changes or replacements should belong to the scope of protection of the appended claims of the present application.

What is claimed is:

1. A display panel, comprising:
a photosensitive array, wherein the photosensitive array comprises at least one set of photosensitive units arranged in an array;
an acquisition module, electrically connected to the photosensitive units and configured to acquire photosensitive data of the photosensitive array, and wherein the photosensitive data comprises previous frame photosensitive data and current frame photosensitive data; and
a process module, connected to the acquisition module, configured to acquire target frame photosensitive data according to a difference result between the current frame photosensitive data and the previous frame photosensitive data, and to determine a current frame display coordinate of an external light source based on the target frame photosensitive data, wherein the current frame display coordinate is a display coordinate corresponding to the current frame photosensitive data;
wherein the process module comprises a process unit and a storage unit; the process unit and the storage unit are connected to the acquisition module; the storage unit is configured to cache the previous frame photosensitive data; and the process unit is configured to determine the current frame display coordinate;
wherein the photosensitive data acquired by the acquisition module comprises a photosensitive coordinate of at least one of the photosensitive units and read-out data corresponding to the photosensitive coordinate; the process unit acquires target read-out data in the target frame photosensitive data according to a difference result between read-out data in the current frame photosensitive data corresponding to the same photosensitive coordinate and read-out data in the previous frame photosensitive data, and acquires a current frame average photosensitive coordinate of the external light source based on the photosensitive coordinate of each of the photosensitive units and the target read-out data corresponding to the photosensitive coordinate, and the current frame average photosensitive coordinate is an average photosensitive coordinate corresponding to the current frame photosensitive data;
wherein the photosensitive coordinate comprises a photosensitive abscissa and a photosensitive ordinate; the current frame average photosensitive coordinate comprises a current frame average photosensitive abscissa and a current frame average photosensitive ordinate; and the process unit acquires the current frame average photosensitive abscissa of the external light source based on the photosensitive ordinate and the target read-out data corresponding to each of the photosensitive units.

2. The display panel according to claim 1, wherein the process unit acquires the current frame average photosensitive abscissa according to a formula as follows:

$$x_A = \frac{\sum_{i=1, j=1}^{i=n, j=m} C_i D_{ij}}{\sum_{i=1}^{n} C_i}$$

wherein $x_A$ indicates the current frame average photosensitive abscissa; $C_i$ indicates a current column number of the photosensitive units in the photosensitive array; $D_{ij}$ indicates the target read-out data of the photosensitive unit of a $j^{th}$ row and an $i^{th}$ column in the photosensitive array; m indicates a total photosensitive row number of the photosensitive units in the photosensitive array; and n indicates a total photosensitive column number of the photosensitive units in the photosensitive array.

3. The display panel according to claim 2, wherein the process unit acquires the current frame average photosensitive ordinate of the external light source based on the photosensitive abscissa and the target read-out data corresponding to each of the photosensitive units.

4. The display panel according to claim 3, wherein the process unit acquires the current frame average photosensitive ordinate according to a formula as follows:

$$y_A = \frac{\sum_{i=1, j=1}^{i=n, j=m} R_j D_{ij}}{\sum_{j=1}^{n} R_j}$$

wherein $y_A$ indicates the current frame average photosensitive ordinate; indicates a current row number of the photosensitive units in the photosensitive array; and $D_{ij}$ indicates the target read-out data of the photosensitive unit of the $j^{th}$ row and the $i^{th}$ column in the photosensitive array.

5. The display panel according to claim 4, wherein a total display row number of sub-pixels in the display panel is M; a total display column number of the sub-pixels in the display panel is N; and the current frame display coordinate comprises a current frame display abscissa and a current frame display ordinate;
the process unit determines the current frame display abscissa of the external light source based on the total photosensitive row number, the total display row number, and the current frame average photosensitive abscissa; and
the process unit determines the current frame display ordinate of the external light source based on the total photosensitive column number, the total display column number, and the current frame average photosensitive ordinate.

6. The display panel according to claim 5, wherein the current frame display abscissa is acquired according to a formula as follows:

$$X_A = M \times x_A \div m$$

wherein $X_A$ indicates the current frame display abscissa; and/or the current frame display ordinate is acquired according to a formula as follows:

$$Y_A = N \times x_A \div n$$

wherein $Y_A$ indicates the current frame display ordinate.

7. A photosensitive display device, comprising a display panel, wherein the display panel comprises:
a photosensitive array, wherein the photosensitive array comprises at least one set of photosensitive units arranged in an array;
an acquisition module, electrically connected to the photosensitive units and configured to acquire photosensitive data of the photosensitive array, and wherein the photosensitive data comprises previous frame photosensitive data and current frame photosensitive data; and
a process module, connected to the acquisition module, configured to acquire target frame photosensitive data according to a difference result between the current frame photosensitive data and the previous frame photosensitive data, and to determine a current frame display coordinate of an external light source based on the target frame photosensitive data, wherein the current frame display coordinate is a display coordinate corresponding to the current frame photosensitive data;
wherein the process module comprises a process unit and a storage unit; the process unit and the storage unit are connected to the acquisition module; the storage unit is configured to cache the previous frame photosensitive data; and the process unit is configured to determine the current frame display coordinate;
wherein the photosensitive data acquired by the acquisition module comprises a photosensitive coordinate of at least one of the photosensitive units and read-out data corresponding to the photosensitive coordinate; the process unit acquires target read-out data in the target frame photosensitive data according to a difference result between read-out data in the current frame photosensitive data corresponding to the same photosensitive coordinate and read-out data in the previous frame photosensitive data, and acquires a current frame average photosensitive coordinate of the external light source based on the photosensitive coordinate of each of the photosensitive units and the target read-out data corresponding to the photosensitive coordinate, and the current frame average photosensitive coordinate is an average photosensitive coordinate corresponding to the current frame photosensitive data;
wherein the photosensitive coordinate comprises a photosensitive abscissa and a photosensitive ordinate; the current frame average photosensitive coordinate comprises a current frame average photosensitive abscissa and a current frame average photosensitive ordinate; and the process unit acquires the current frame average photosensitive abscissa of the external light source based on the photosensitive ordinate and the target read-out data corresponding to each of the photosensitive units.

8. The photosensitive display device according to claim 7, wherein the process unit acquires the current frame average photosensitive abscissa according to a formula as follows:

$$x_A = \frac{\sum_{i=1, j=1}^{i=n, j=m} C_i D_{ij}}{\sum_{i=1}^{n} C_i}$$

wherein $x_A$ indicates the current frame average photosensitive abscissa; $C_i$ indicates a current column number of the photosensitive units in the photosensitive array; $D_{ij}$ indicates the target read-out data of the photosensitive unit of a $j^{th}$ row and an $i^{th}$ column in the photosensitive array; m indicates a total photosensitive row number of the photosensitive units in the photosensitive array; and n indicates a total photosensitive column number of the photosensitive units in the photosensitive array.

9. The photosensitive display device according to claim 8, wherein the process unit acquires the current frame average photosensitive ordinate of the external light source based on the photosensitive abscissa and the target read-out data corresponding to each of the photosensitive units.

10. The photosensitive display device according to claim 9, wherein the process unit acquires the current frame average photosensitive ordinate according to a formula as follows:

$$y_A = \frac{\sum_{i=1, j=1}^{i=n, j=m} R_j D_{ij}}{\sum_{j=1}^{n} R_j}$$

wherein $y_A$ indicates the current frame average photosensitive ordinate; indicates a current row number of the photosensitive units in the photosensitive array; and $D_{ij}$ indicates the target read-out data of the photosensitive unit of the $j^{th}$ row and the $i^{th}$ column in the photosensitive array.

11. The photosensitive display device according to claim 10, wherein a total display row number of sub-pixels in the display panel is M; a total display column number of the sub-pixels in the display panel is N; and the current frame display coordinate comprises a current frame display abscissa and a current frame display ordinate;
the process unit determines the current frame display abscissa of the external light source based on the total photosensitive row number, the total display row number, and the current frame average photosensitive abscissa; and
the process unit determines the current frame display ordinate of the external light source based on the total photosensitive column number, the total display column number, and the current frame average photosensitive ordinate.

12. The photosensitive display device according to claim 11, wherein the current frame display abscissa is acquired according to a formula as follows:

$$X_A = M \times x_A \div m$$

wherein $X_A$ indicates the current frame display abscissa; and/or
the current frame display ordinate is acquired according to a formula as follows:

$$Y_A = N \times x_A \div n$$

wherein $Y_A$ indicates the current frame display ordinate.

* * * * *